United States Patent [19]

Heldwein

[11] Patent Number: 5,097,949
[45] Date of Patent: Mar. 24, 1992

[54] STATIC SHIELDING BAG

[75] Inventor: Franz C. Heldwein, Rochester, N.Y.

[73] Assignee: Westvaco Corporation, New York, N.Y.

[21] Appl. No.: 669,895

[22] Filed: Mar. 15, 1991

[51] Int. Cl.$^5$ ............................................. B65D 81/24
[52] U.S. Cl. .................... 206/328; 206/524.2; 428/35.3
[58] Field of Search ............... 206/328, 331, 332, 333, 206/524.2; 428/35.3

[56] References Cited

U.S. PATENT DOCUMENTS

| | | | |
|---|---|---|---|
| 4,154,344 | 3/1979 | Yenni, Jr. et al. | |
| 4,360,550 | 11/1982 | Asakura et al. | 428/35.3 |
| 4,407,872 | 10/1983 | Horii | |
| 4,424,900 | 1/1984 | Petcavich | |
| 4,496,406 | 1/1985 | Dedow | |
| 4,529,087 | 7/1985 | Neal | 206/328 |
| 4,559,259 | 12/1985 | Cetrelli | |
| 4,609,104 | 9/1986 | Kasper et al. | 206/328 |
| 4,658,958 | 4/1987 | McNulty et al. | 206/328 |
| 4,684,020 | 8/1987 | Ohlbach | 206/328 |
| 4,699,830 | 10/1987 | White | 206/328 |
| 4,756,414 | 7/1988 | Mott | 206/328 |
| 4,875,581 | 10/1989 | Ray et al. | 206/328 |

Primary Examiner—Jimmy G. Foster

[57] ABSTRACT

A static shielding package is disclosed comprising an open end, a folded bottom and sealed side edges formed from a substantially rectangular transparent, flexible laminated segment of sheet material. The sheet material comprises an inner heat sealable carrier layer, an outer protective layer and a conductive layer sandwiched between said carrier layer and protective layer wherein said sheet material is folded over upon itself along a fold region to form the folded bottom of the package. The improvement comprises the addition of an auxiliary strip of static shielding material added to the package in the region of the folded bottom of the package to provide an alternative path for the conduction of electrical energy in the event of a disruption of the primary conductive layer of the package in the region of the fold area.

12 Claims, 2 Drawing Sheets

STATIC SHIELDING BAG

BACKGROUND OF INVENTION

The present invention relates generally to packaging, and more particularly to packaging for electrically sensitive components which require shielding from electrical fields. Many electronic components such as metal oxide semiconductor devices are sensitive to electrostatic discharges when in their component form and can be damaged by electrostatic discharges prior to the components being installed in an electronic circuit.

Generally two different methods for protecting such electronic components are presently in use. Either the leads of each component are shorted together via a metal or conductive plastic polymeric sheet member, or the entire component is enclosed in a protective envelope. By and large the most popular and least expensive method is the use of a static shielding bag or pouch which is preferably transparent or semi-transparent to allow visual inspection of the packaged electronic component.

Currently there are several commercially available packaging products made from laminated sheets for electrically shielding electronic components. One of such products is an antistatic shield bag manufactured and distributed by Minnesota Mining and Manufacturing Company (3M Company). The 3M envelope or package is described in U.S. Pat. No. 4,154,344. Other U.S. Patents which show related products include U.S. Pat. Nos. 4,407,872; 4,424,900; 4,496,406; and 4,699,830. In each case, the laminated sheets which comprise the static shielding bags include one or more conductive metallized layers buried within the laminated structure. While the laminated sheets described in the aforementioned patents provide a surface resistivity sufficient to dissipate static and other electrical charges that could otherwise damage an electronic component, packages made from these sheets do not always accomplish the intended result. They often fail to do so because of breakdowns in the conductive metallized layers which occur during the fabrication steps for converting the sheets into bags or pouches.

It would be desirable, therefore, to provide a flexible, transparent laminated sheet which could be converted into a pouch or bag for packaging sensitive electronic components that would not lose its resistivity characteristics during the converting process, as well as repeated use in the field. It would also be desirable to create such a package that is transparent and capable of being sealed to itself. It would also be desirable to have a flexible sheet material which would provide a low surface resistivity for the outer structure of the bag or pouch and which would provide secondary static shielding protection in the event the resistivity of the outer structure is compromised and the static dissipation or static shielding properties are reduced, impaired or eliminated.

SUMMARY OF INVENTION

The invention herein is directed to an improved laminated sheet material and bag or pouch constructed therefrom which exhibits a low surface resistivity on its outer surface to provide static dissipation and static shielding. The improvement comprises the addition of an inner strip of static shielding material applied to the bag or pouch to provide a reinforcement against penetration of electrical fields in the most critical area of the bag or pouch formed from the laminated sheet material.

Such bags are usually formed by unwinding the laminated material provided in roll form, and cutting the laminated material into blanks which are folded over upon themselves in a "U" shape. The "U" shaped blanks are then side seamed preferably by heat sealing or with adhesive to produce a bag or pouch with an open end and a folded bottom. When any laminated material, and particularly a laminated material including a metal layer is folded, the most critical area is in the region of the fold. In this region the laminate is subjected to great stress. The outside surface is subject to a strong stretching while the inside layer is compressed with a tendency toward wrinkling along the fold lines. When the laminate includes a metal layer, the metal layer has a tendency toward breaking when the bottom fold is made. The metal layer, conductive by nature, functions as a static shield (Faraday Cage Effect) unless its integrity and/or continuity is broken, in which case the bag or pouch so constructed is not only rendered useless, but counterproductive. In such a case, the broken metal layer of the laminate provides two separated metal ends at the fold which tend to function as a capacitor, i.e, they store electrical energy rather than dissipate the energy as is required for the static shield.

U.S. Pat. No. 4,559,259 teaches a method of addressing the problem of stress cracking in the fold area of a laminated material involving the use of auxiliary crease lines in the region of the fold. However, in the present invention, the same problem is addressed by adding an auxiliary strip of the laminate material, or a similar material, to the blank used to fabricate the bag in the region of the fold. The auxiliary strip increases the mechanical characteristics of the laminate material in the fold area thus reducing the risk of internal collapse which could cause a crease producing disruption of the metal layer of the laminate. The strip also increases the interior radius of the bottom fold allowing the outer radius to maintain a higher profile to further reduce the possibility of disruption of the metal layer of the laminate. In the event that the auxiliary strip is prepared from the same material as the laminate structure, the metal layer of the strip may collapse and rupture during folding but the metal layer in the critical area of the outer material will remain intact. However, even if the conductive metal layer in the outer laminate is ruptured, the intact conductive metal layer in the auxiliary strip will provide an alternative path for the flow of electricity, thus maintaining the static shielding properties of the bag.

The laminated material of the present invention preferably has an antistatic outer layer which provides a surface resistivity in the range of from about $10^8$ to about $10^{13}$ ohms per square. The antistatic outer layer can be selected from any transparent, polymeric, printable material such as polyethylene, cellophane, or polypropylene, but is preferably a polyester material of about 1 to 4 mils thickness. Adhered to, or deposited on the outer antistatic layer is a conductive metal layer having a surface resistivity of from about $10^2$ to $10^3$ but preferably less than about $10^5$ ohms per square. Bonded to the conductive metal layer by a suitable adhesive or the like is a carrier film layer which provides strength and body (puncture resistance) for the overall laminated sheet material. The carrier film layer is preferably a transparent, heat sealable polymeric material such as a polyolefin based material selected from the group consisting of co-extrusions of various polymers, but is preferably low density polyethylene having a thickness of from about 1 to 4 mils, preferably 2.6 mils.

When the auxiliary strip material is prepared from the same laminating material used to form the bag or pouch of the present invention, the strips are attached to the bag blanks cut from the roll of laminated material by a suitable adhesive or the like, preferably a pressure sensitive adhesive. Of course other strip materials could be used for carrying out the present invention as long as the strip materials include a conductive element. Examples of such components include the materials used in the fabrication of susceptor elements for packages used in microwave ovens. Other examples inlcude semi-rigid or rigid profiles. In each case, the static shielding reinforcing strip would be adhered to the bag blank in the region where the bottom fold is to be made.

The carrier film layer of the packaging laminate is selected from a material which can provide a bonding to itself through any suitable means. A particularly preferred carrier film layer is a heat sealable material which can bond to itself upon the application of heat and/or pressure. The laminated sheet material can thereby be formed into the packaging of the present invention in the form of bags or pouches. For example, a blank of the laminated sheet material including the static shielding reinforcing strip may be folded over upon itself in the region of the auxiliary strip and the carrier layer heat sealed to itself at the edges of the bag blank to form side seams. The top exposed edges would be left open so as to provide an opening for the introduction of the electronic components into the bag and such opening would be subsequently closed by heat sealing, zipper closure or folded-over.

DETAILED DESCRIPTION

Figure 1:
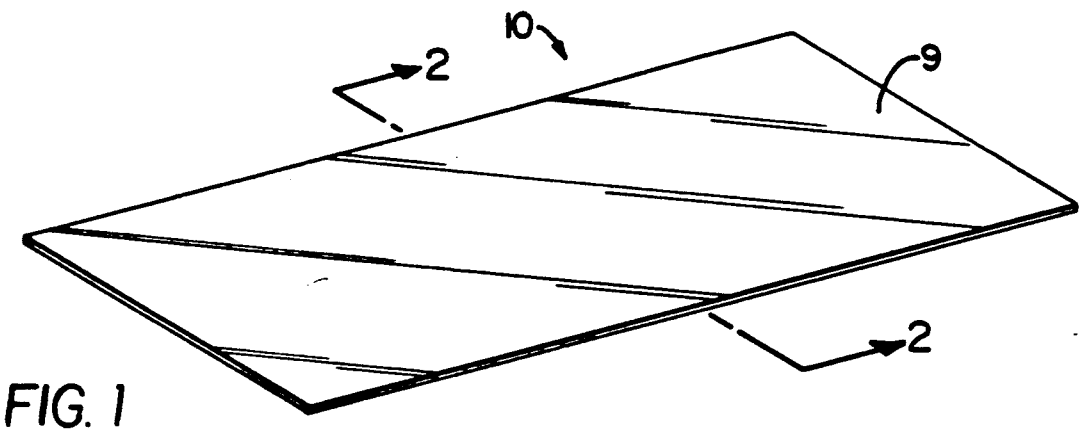
FIG. 1 is a perspective view of a blank of laminated material as disclosed in the prior art for making static shielding packaging.
Figure 2:
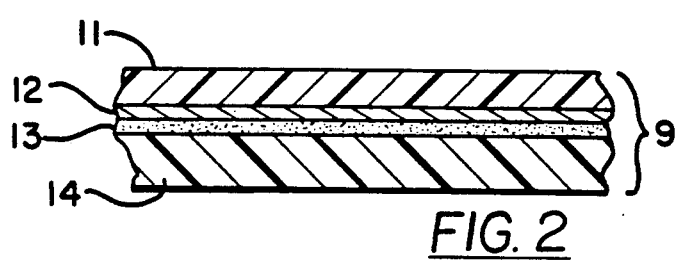
FIG. 2 is an enlarged fragmentary cross sectional view through the blank of FIG. 1 taken along the lines 2—2.
Figure 3:
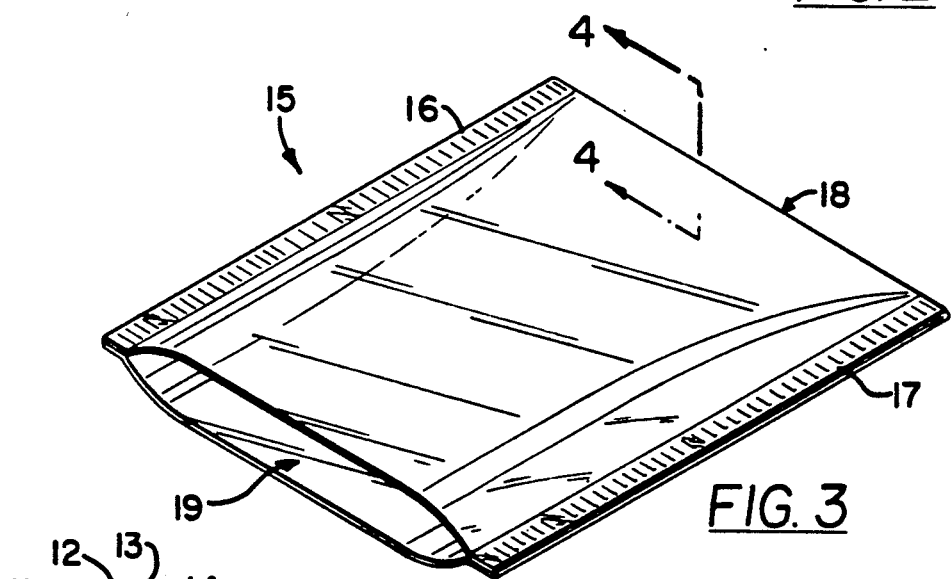
FIG. 3 is a perspective view of an envelope package constructed from the sheet of laminated material shown in FIG. 1.
Figure 4:
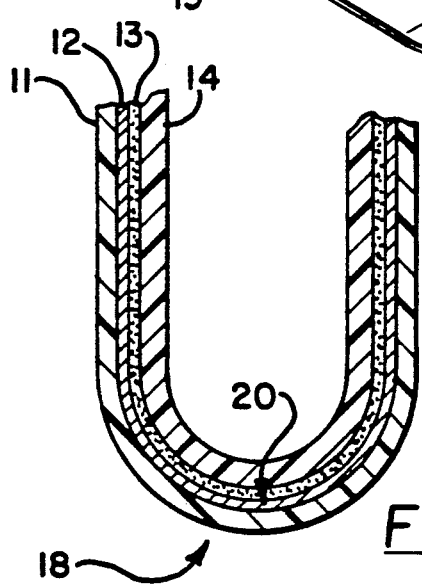
FIG. 4 is an enlarged fragmentary cross sectional view through the fold area of the package of FIG. 3.

Referring now more particularly to the Figures of drawing, a blank of laminated material 9 is illustrated in FIG. 1 that is useful for making a bag or pouch-type package well known in the prior art. FIG. 2 illustrates the construction of the laminate comprising an antistatic carrier layer 14 which is heat sealable to itself and which forms the interior of the bag, an adhesive or heat sealable layer 13, a conductive metal layer 12 and an outer protective layer 11 which forms the outer surface of the bag. The bag 15 is constructed as shown in FIG. 3 wherein the blank of laminated material 9 is folded over upon itself along a fold area 18, and the side edges are side seamed by heat and pressure or adhesive at 16 and 17 to yield an open end 19. Unfortunately, the weakest point of the bag construction is the fold area 18 as shown in FIG. 4. When this fold is made it is possible to break the conductive metal layer 12 as shown at 20 at the point of highest stress. When this occurs the electrical dissipative properties of the antistatic carrier layer 14 are compromised exposing any sensitive electrical components packaged in the bag to damage.

Figure 5:
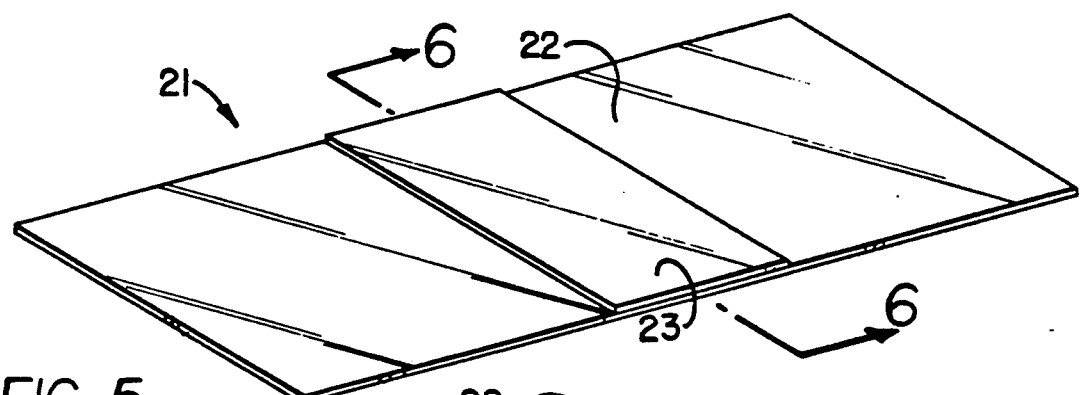
FIG. 5 is a perspective view of a blank of laminated material including the static shielding reinforcing strip of the present invention.
Figure 6:
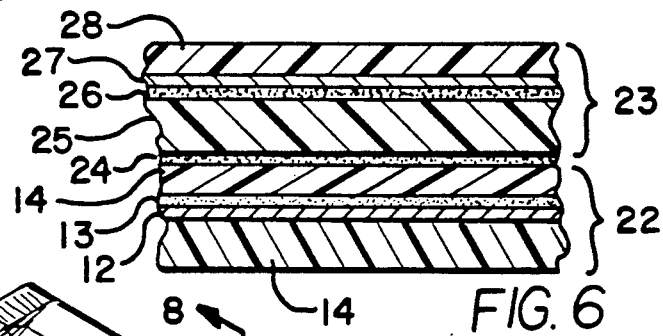
FIG. 6 is an enlarged fragmentary cross sectional view through the blank of FIG. 5 taken along the lines 6—6.
Figure 7:
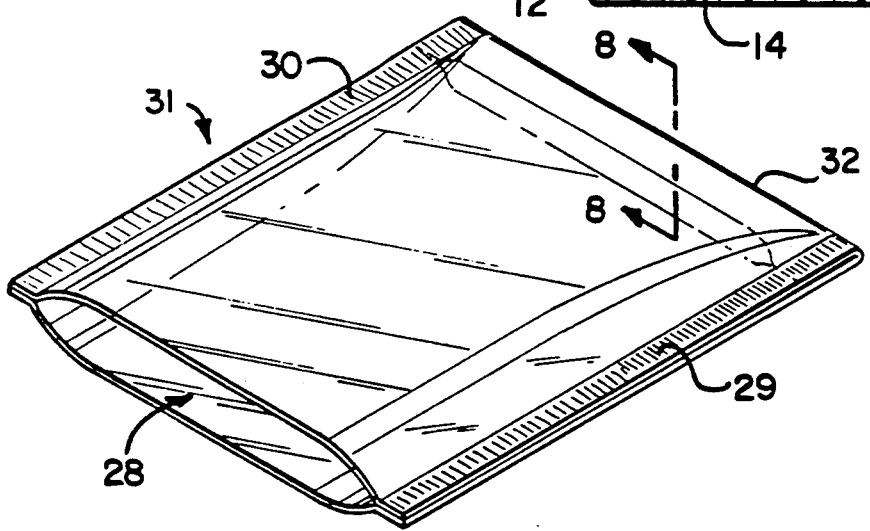
FIG. 7 is a perspective view of an envelope package constructed from the blank of laminated material shown in FIG. 5; and, FIG. 8 is an enlarged fragmentary cross sectional view through the fold area of the package of FIG. 7.
Figure 8:
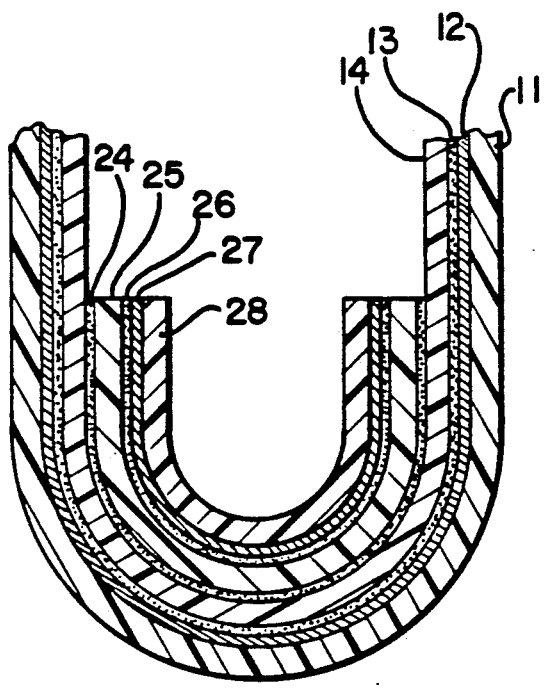

In order to overcome this disadvantage of the prior art packaging, the present invention provides an auxiliary strip of material in the fold region of the bag which has the same or greater conductivity as the package laminate itself. The strip 23 is applied to the inner surface of the blank 21 of laminated material 22 as shown in FIG. 5. FIG. 6 illustrates a typical cross sectional construction according to the present invention wherein both the strip 2 and laminate 22 comprise the same materials joined together by a layer of adhesive 24. For instance, in a preferred embodiment the laminate 22 comprises an antistatic carrier layer 14, adhesive layer 13, conductive metal layer 12 and outer protective layer 11, while the strip 23 comprises a carrier layer 25, adhesive layer 26, conductive layer 27 and an outer protective layer 28. However, it will be understood that the auxiliary strip material 23 may take other forms as long as it includes at least one conductive metal layer or as long as its profile assures the integrity of the primary conductive metal layer in the region of any fold. When the construction according to FIGS. 5 and 6 is formed into a bag as shown in FIG. 7, the fold 32 has a greater radius than a conventional prior art bag, and increased mechanical strength provided by the strip 23 to reduce stresses that might cause disruption of the conductive metal layer 12 in the region of the fold. Moreover, even if metal layer 12 is disrupted by some outside force in the region of the fold 32, the continuity of the electrical characteristics of the bag 31 are not compromised since the conductive layer 27 of the auxiliary strip 23 will remain intact providing a continuous path for the flow of electricity to dissipate any accumulated electrical charges. This is accomplished because of the characteristic of electrical energy to follow the path of least resistance. Thus, with the bag of the present invention, accumulated electrical energy would flow from the conductive metal layer 12 of the outer bag structure through the bag structure to the conductive metal layer 27 of the auxiliary strip member 23 (and vice versa) to avoid any disruption in the outer conductive metal layer 12.

The thickness of the conductive metal layers 12 and 27 can vary depending upon the type of metal selected, since the controlling criteria for the amount of metal in the layer is the preferred surface resistivity to be provided. For the laminated sheet material herein, it is preferred that the metal layer provide a surface resistivity of less than about $10^5$ ohms per square. At such a surface resistivity the buried metal layer provides the protection of a Faraday cage to the overall structure of the bag or pouch formed from the laminated material. The conductive metal layer is continuous and can be deposited on the protective substrate layer by any available means such as vacuum deposition or sputter metallization. Such products are well known and readily available on the market.

Likewise, suitable adhesives are readily available for bonding vacuum deposited films to carrier substrates as required by the present invention. The auxiliary strips of the present invention may be readily bonded to the blanks of laminated material for making the bags using a similar adhesive with the same type apparatus used to patch window envelopes or the like. The result being separate blanks or segments of laminated material electrically reinforced in the region of the fold.

Although there has been described hereinbefore the specific details of an improved static shielding bag according to the present invention, it will be appreciated that the invention is not limited thereto. Accordingly, any and all modifications, variations, equivalents or the like which may occur to those skilled in the art should be considered to be within the scope of the invention as defined in the appended claims.

What is claimed is:

1. A generally rectangular shaped blank of packaging material (21) having side edges, opposed ends and a centrally located fold area, adapted to be formed into a package to receive and protect electronic components, said blank comprising in combination:
    (a) a primary layer of laminated sheet material (22) having a first inner carrier layer (14) of electrically insulating material capable of being heat sealable to itself, a second outer protective layer (11) of a substantially transparent and printable material located exterior to said first carrier layer, and a first conductive layer (12) sandwiched between said first and second layers; and,
    (b) an auxiliary strip of laminated sheet material (23) comprising a second carrier layer (25) and at least one additional conductive layer (27) bonded to the carrier layer (14) of the laminated sheet material (22) in the region of the fold area (32) of the blank, said auxiliary strip (23) having substantially the same width as the primary layer (22) but lesser length to increase the thickness of the blank only in the region of the fold area and provide increased mechanical strength, so that the radius of any fold made in the fold area (32) will be great enough to reduce stresses that might cause a disruption of the conductive layer (12) when the blank is formed into a package (31).

2. The blank of claim 1 wherein the first inner carrier layer is a transparent, heat sealable polymeric material selected from the group consisting of polyethylene, polypropylene and coextrusions of polyethylene and polypropylene.

3. The blank of claim 2 wherein the first inner carrier layer has a thickness of from about 1 to 4 mils.

4. The blank of claim 3 wherein the second outer protection layer is a transparent printable material selected from the group consisting of polyesters, polyethylene and polypropylene.

5. The blank of claim 4 wherein the second outer protective layer has a thickness of from about 1 to 4 mils.

6. The blank of claim 5 wherein said first conductive layer comprises a metallic layer adhered to the inner surface of said outer protective layer.

7. The blank of claim 6 wherein said first conductive layer has a surface resistivity of less than about $10^5$ ohms per square.

8. The blank of claim 7 wherein said inner carrier layer has a surface resistivity of at least about $10^8$ ohms per square.

9. The blank of claim 8 wherein the first conductive layer is adhesively bonded to the outer surface of said inner carrier layer between said carrier layer and said outer protective layer.

10. The blank of claim 9 wherein the conductive layer of said auxiliary strip material is adhesively bonded to the inner surface of said first carrier layer between said first and second carrier layers.

11. An open end package formed from the blank of claim 10 wherein said side edges are heat sealed together after said blank element is folded over upon itself along the region of said fold area.

12. An open end package adapted to receive and protect electronic components, formed from a blank of substantially transparent, flexible sheet material said blank having side edges and a fold region, said blank comprising a primary layer of laminated sheet material having an inner carrier layer of a heat sealable polymeric material, an adhesive layer, a metal conductive layer and an outer protective layer, all bonded together, said blank being folded over upon itself along said fold region and said side edges being heat sealed together, the improvement comprising the addition of an auxiliary strip of laminated sheet material bonded to the inner surface of the carrier layer in the region of said fold area, said auxiliary strip of material comprising at least one additional conductive layer and a second carrier layer having substantially the same width as the primary layer of laminated material but lesser length so as to increase the thickness of the blank only in the region of the fold area to provide an alternative path for the conduction of electrical energy in the event of a disruption of the first conductive layer in said fold area.

* * * * *